(12) United States Patent
Butzmann

(10) Patent No.: US 9,550,423 B2
(45) Date of Patent: Jan. 24, 2017

(54) INTERLOCK SWITCHING CIRCUIT FOR PROTECTING AN ELECTRICAL ON-BOARD POWER SUPPLY

(71) Applicants: Robert Bosch GmbH, Stuttgart (DE); Samsung SDI Co., Ltd., Yongin-si, Gyeonggi-do (KR)

(72) Inventor: Stefan Butzmann, Schalksmühle (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 0 days.

(21) Appl. No.: 14/917,776

(22) PCT Filed: Sep. 8, 2014

(86) PCT No.: PCT/EP2014/069028
§ 371 (c)(1),
(2) Date: Mar. 9, 2016

(87) PCT Pub. No.: WO2015/043930
PCT Pub. Date: Apr. 2, 2015

(65) Prior Publication Data
US 2016/0214485 A1    Jul. 28, 2016

(30) Foreign Application Priority Data
Sep. 24, 2013 (DE) .................. 10 2013 219 141

(51) Int. Cl.
*H02H 3/08* (2006.01)
*B60L 3/04* (2006.01)
(Continued)

(52) U.S. Cl.
CPC ............ *B60L 3/04* (2013.01); *B60L 3/0046* (2013.01); *B60L 3/0069* (2013.01); *B60L 3/0092* (2013.01);
(Continued)

(58) Field of Classification Search
USPC ................................ 361/93.7–93.9
See application file for complete search history.

(56) References Cited

U.S. PATENT DOCUMENTS 6,466,422 B2 * 10/2002 Luo .................. G05F 1/575
361/18
2002/0089378 A1 * 7/2002 Wu .................. H03F 3/45085
330/253
(Continued)

FOREIGN PATENT DOCUMENTS

DE    199 00 978 A1    7/2000
DE    695 27 694 T2    12/2002
(Continued)

OTHER PUBLICATIONS

International Search Report corresponding to PCT Application No. PCT/EP2014/069028, mailed Feb. 19, 2015 (German and English language document) (5 pages).

*Primary Examiner* — Danny Nguyen
(74) *Attorney, Agent, or Firm* — Maginot, Moore & Beck LLP

(57) ABSTRACT

An interlock switching circuit for protecting an electrical on-board power supply for an electrically drivable vehicle includes a conductor loop, a first current source, a first current mirror and a second current mirror. The first current source is configured to drive a current flowing out of an input of the first current mirror into an input of the second current mirror. The conductor loop is connected between an output of the first current mirror and an output of the second current mirror.

16 Claims, 4 Drawing Sheets

(51) Int. Cl.
*B60L 3/00* (2006.01)
*G01R 31/02* (2006.01)
*H02H 9/02* (2006.01)
*G05F 1/573* (2006.01)

(52) U.S. Cl.
CPC ........... G01R 31/024 (2013.01); G01R 31/025 (2013.01); *B60L 2240/547* (2013.01); *B60L 2240/549* (2013.01); *G01R 31/026* (2013.01); *G05F 1/573* (2013.01); *H02H 9/025* (2013.01)

(56) References Cited

U.S. PATENT DOCUMENTS

2005/0104633 A1* 5/2005 Elend .................... H04L 25/028
327/108
2009/0073624 A1 3/2009 Scholer et al.

FOREIGN PATENT DOCUMENTS

| DE | 10 2004 049 082 A1 | 4/2006 |
| DE | 10 2010 056 006 A1 | 6/2012 |
| JP | 2009-61935 A | 3/2009 |
| WO | 00/14555 A1 | 3/2000 |
| WO | 2013/068166 A2 | 5/2013 |

* cited by examiner

INTERLOCK SWITCHING CIRCUIT FOR PROTECTING AN ELECTRICAL ON-BOARD POWER SUPPLY

This application is a 35 U.S.C. §371 National Stage Application of PCT/EP2014/069028, filed on Sep. 8, 2014, which claims the benefit of priority to Serial No. DE 10 2013 219 141.3, filed on Sep. 24, 2013 in Germany, the disclosures of which are incorporated herein by reference in their entirety.

BACKGROUND

The present disclosure relates to an interlock switching circuit for protecting an electrical on-board power supply of an electrically drivable vehicle. In particular, the present disclosure relates to improvements in efficiency during the operation of an interlock switching circuit.

Interlock switching circuits are utilized in battery systems in order to ensure the high-voltage safety of an electrical system, such as, for example, an electrical drive train. Another known name for an interlock switching circuit is the term "pilot line". In this case, a low-voltage conductor loop is installed through the components to be monitored. If this conductor loop is interrupted, for example, by the opening of a connection between the components, current can no longer flow through the conductor loop and this is detected by an evaluation unit. The evaluation unit can be disposed, for example, in a battery module within a battery housing. Typically in this case, so-called contactors are then opened, and so the entire high-voltage network in the vehicle is switched to a de-energized state. Current sources for generating the interlock signals have been used to an increasing extent recently in the prior art, since these have the advantage that, when a current is known, other evaluation circuits can also monitor the integrity of the interlock switching circuit. In this regard, FIG. 1 shows a typical interlock current source circuit 1, in which a current source is realized with a bipolar transistor T and an operational amplifier OP and the current direction is set by the four switches $S_1$, $S_2$, $S_3$, $S_4$. The external components are depicted in the figure by the resistor ZL within the conductor loop 2. On the input side, the operational amplifier OP is supplied by a reference voltage source $U_{Ref}$ and a voltage dropping at an ohmic resistor R which is disposed between the transistor T and the electrical ground. The disadvantage of the depicted circuit topology is the voltage drop across the current source T, which adversely affects the mode of operation in the case of low supply voltages and high-resistance loads $Z_L$. It is also disadvantageous that a short-circuit protection for the two switches $S_1$, $S_2$, for example by connecting a resistor to the output in series, further increases the required supply voltage $U_B$.

SUMMARY

In order to avoid the aforementioned disadvantages, an interlock switching circuit for protecting an electrical on-board power supply of an electrically drivable vehicle is proposed. It comprises a conductor loop which accompanies a connection of an arrangement of high voltage components in the on-board power supply, which connection is intended to be protected. In addition, a first current source, a first current mirror, and a second current mirror are provided. The design and mode of operation of a current mirror are known to a person skilled in the art in the field of circuit engineering and are therefore not discussed in detail, to ensure clarity. In this case, the first current source is designed to drive a current flowing out of the input of the first current mirror into the input of the second current mirror. In other words, the first current source "pulls" a current, on the input side, out of the first current mirror and guides this, on the input side, into the second current mirror. In this case, the conductor loop is connected between an output of the first current mirror and the output of the second current mirror. In other words, a current flowing out of the output of the first current mirror flows through the conductor loop before it flows through the output side of the second current mirror. As compared to the prior art, a short-circuit current limitation is realized by the interlock switching circuit according to the disclosure, so that a short circuit between the conductor loop and the supply voltage $U_B$ does not cause any damage.

The dependent claims show preferred refinements of the disclosure. Further preferably, the interlock switching circuit comprises a regulator, a first voltage divider, and a second voltage divider. The first voltage divider and the second voltage divider can each comprise, for example, two ohmic, series-connected resistors. In this case, the first voltage divider is disposed parallel to the conductor loop between the output of the first current mirror and the output of the second current mirror. In particular, the resistors of a particular voltage divider can have essentially the same values. In addition, the second voltage divider is designed to provide a reference variable for the regulator. This can be implemented, for example, by disposing the second voltage divider between the supply voltage $U_B$ and the electrical ground. The second voltage divider can also have two ohmic resistances having essentially the same magnitude. The input of the regulator is disposed between the first voltage divider and the second voltage divider. In other words, a first input terminal of the regulator is disposed at the output of the first voltage divider and a second connection of the regulator is disposed at the output of the second voltage divider. In this case, the first voltage divider, which is disposed parallel to the conductor loop, is designed with particularly high resistance in order to generate a low power loss during normal operation. As a result, the output of the first voltage divider provides the desired mid-potential of the interlock switching circuit for the regulator. In this case, the voltage generated at the second voltage divider is used to provide a setpoint variable for the regulator. In this manner, a conductor loop of an interlock switching circuit for protecting a high voltage network can be operated with low power loss.

Advantageously, the interlock switching circuit further comprises a second current source and a rectifier element. The rectifier element can be designed, for example, as a diode which is oriented in the reverse direction, in particular, in the direction of the output of the regulator. In this case, the second current source is designed to feed a current between the output of the first current mirror and the conductor loop. In this case, the current source is also electrically connected to the rectifier element. The output of the regulator is also connected, via the rectifier element, between the output of the first current mirror and the conductor loop. In this case, a current-limiting element, in particular, in the form of an ohmic resistor, for example, can be disposed between the output of the regulator and the second current source or between the output of the regulator and the conductor loop. The regulator circuit is therefore capable of reducing a current flowing into the conductor loop, but is not capable of increasing it. This is also the desired behavior of a regulator, since the current flowing out of the output of the first current mirror is preferably slightly higher than the current through the conductor loop, which is flowing in the output of the second current mirror. In other words, this embodiment of the interlock switching circuit designed according to the disclosure ensures that the potentials of the conductor loop connections disposed at the outputs of the current mirrors become symmetrical about the mid-potential determined by the second voltage divider. In this manner, the feeding point of the second current source in the case of a short circuit is not automatically applied to a potential of the supply voltage. Therefore, by performing a simple measurement of the voltage of the feeding point of the second voltage source with respect to the electrical ground (for example, by means of an A/D converter), it is possible to easily diagnose whether a short circuit is present for the feeding point of the second current source in the direction of the supply voltage.

Further advantageously, the interlock switching circuit according to the disclosure comprises a third current mirror, a first switching device, and a second switching device. In this case, the first switching device is designed to optionally switch the first current source between the input of the first current mirror and the input of the second current mirror, or between the input of the first current mirror and the input of the third current mirror. The second switching device is designed to optionally connect the output of the first current mirror to the output of the second current mirror or to the output of the third current mirror. By suitably controlling the first switching device and/or the second switching device, a simple possibility for determining a current direction of the current through the conductor loop. This makes it possible, for example, to better localize an interruption or a short circuit of the conductor loop.

Further preferably, the conductor loop begins between the second switching device and the output of the second current mirror and ends between the second switching device and the output of the third current mirror. In this manner, the second switching device can optionally electrically connect an input of the conductor loop to the output of the first current mirror and/or can electrically connect the output of the conductor loop to the output of the first current mirror.

In this case, the first switching device and/or the second switching device can each preferably comprise a first and a second transistor, wherein the first transistor of the first switching device is designed to connect the first current source and the input of the third current mirror. In this case, the second transistor of the first switching device is designed to connect the first current source and the input of the second current mirror. The first transistor of the second switching device is designed to connect the outputs of the first current mirror and of the second current mirror. Finally, the second transistor of the second switching device is designed to connect the outputs of the first current mirror and of the third current mirror to one another. The use of individual transistors for producing the above-described electrical connections is a simple, low-cost and functionally reliable—since it is wear-free—possibility for realizing the first and the second switching device.

Further preferably, the first, the second, and the third current mirror each comprise a first and a second transistor. These can be designed as bipolar transistors or as MOSFETs. Alternatively or additionally, the transistors of the first switching device and the transistors of the second switching device can be designed as bipolar transistors or as MOSFETs. When MOSFETs are used, in particular, the resultant power loss is particularly low due to negligible currents.

Further preferably, the interlock switching circuit according to the disclosure comprises a current-direction control unit which is designed to control the first switching device and the second switching device for selecting a current direction through the conductor loop. In other words, the current-direction control unit is connected to units (e.g., transistors) of the first switching device and of the second switching device, via which a current flows through the conductor loop in a first direction or in a second direction. In this manner, a more precise localization of any interruptions of the conductor loop is possible.

Further preferably, the second current mirror has a second voltage ratio and the third current mirror has a third voltage ratio. In this manner, the interlock switching circuit is designed to change the particular current mirrored by the second current mirror or by the third current mirror to a multiple of the current flowing through the first current source, which multiple corresponds to the particular voltage ratio. In this case, in particular, the second voltage ratio and the third voltage ratio can preferably be of the same size.

Generally, it is advantageous when the first current mirror has a first voltage ratio, which is greater than the aforementioned second voltage ratio of the second current mirror and/or the third voltage ratio of the third current mirror. By using the current mirrors, in light of the aforementioned voltage ratios, a short-circuit protection for the interlock switching circuit according to the disclosure can be implemented without using an additional resistor in series to the output, whereby the required supply voltage can be kept low.

BRIEF DESCRIPTION OF THE DRAWINGS

Exemplary embodiments of the disclosure are described in detail in the following with reference to the accompanying drawings. In the drawings.

DETAILED DESCRIPTION

Figure 1:
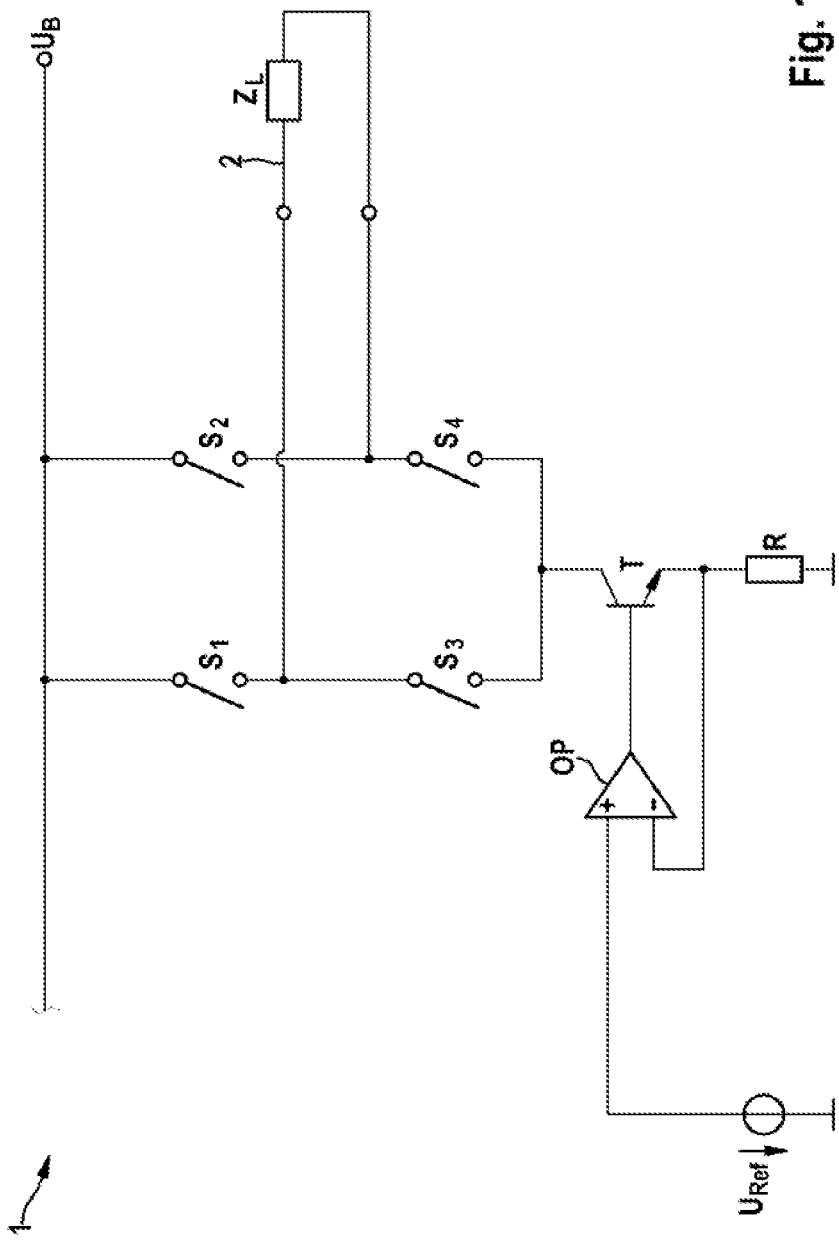
FIG. 1 shows a wiring diagram of an interlock switching circuit.
Figure 2:
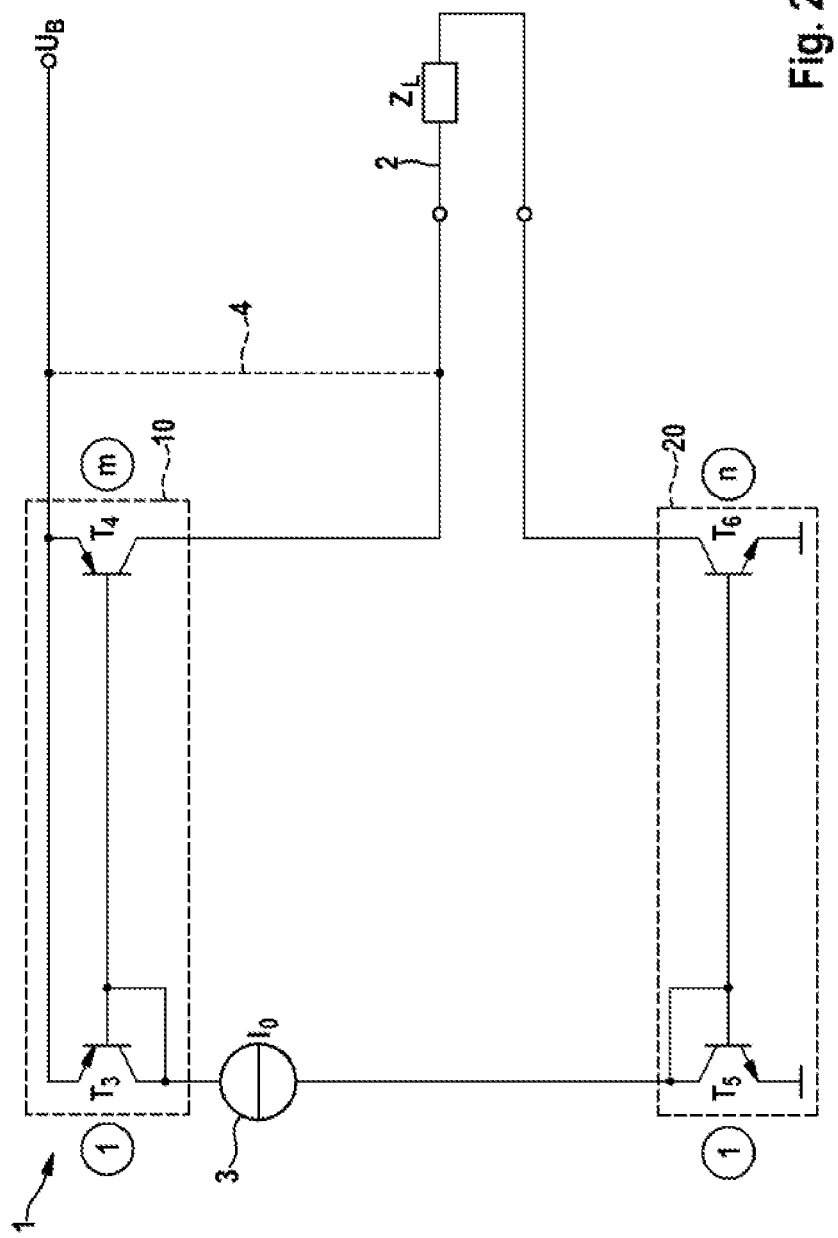
FIG. 2 shows a wiring diagram of a first exemplary embodiment of an interlock switching circuit according to the disclosure.

FIG. 2 shows an exemplary embodiment according to the disclosure of an interlock switching circuit 1. A first current mirror 10 comprises a first transistor $T_3$ and a second transistor $T_4$. In this case, the transistors $T_3$, $T_4$ realize a voltage ratio m. In other words, a current $I_0$, which is generated by a first current source 3 and flows through the first transistor $T_3$ during operation, will flow through the second transistor $T_4$, having been changed m-fold. A second current mirror 20 comprises a first transistor $T_5$ and a second transistor $T_6$. Current $I_0$ of the first current source 3 also flows through the first transistor $T_5$ of the second current mirror 20. It mirrors the current $I_0$ on the output side, having been increased n-fold. The output-side current flowing through the second transistor $T_4$ of the first current mirror 10 flows through an impedance $Z_L$ of a conductor loop 2 before it flows through the second transistor $T_6$ of the second current mirror 20. A battery voltage $U_B$, as the supply voltage, supplies the depicted interlock circuit 1 with electrical energy. By means of the depicted arrangement, a short circuit 4 between the battery voltage $U_B$ and the output of the second transistor $T_4$ of the first current mirror 10 can be detected (as initially described) without any damage occurring to the circuit.

Figure 3:
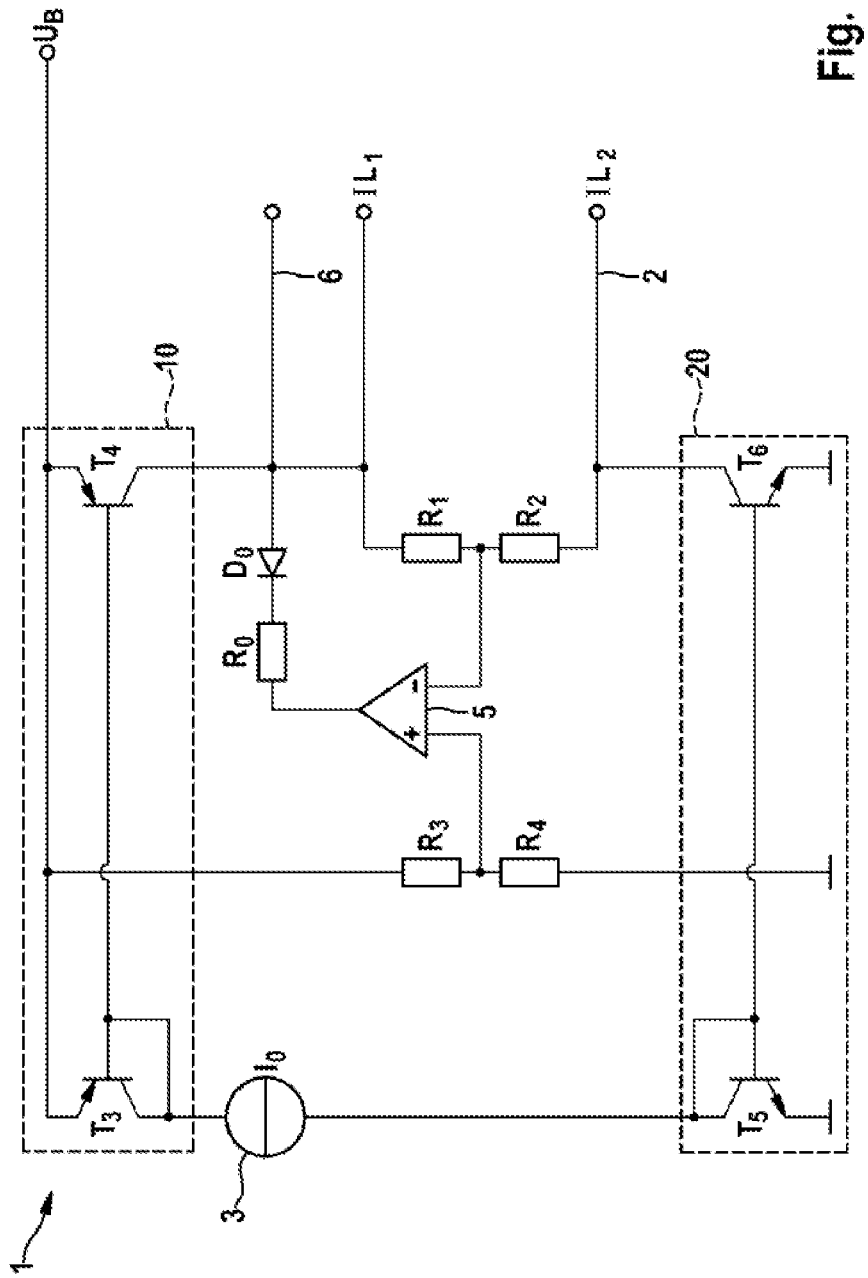
FIG. 3 shows a wiring diagram of a second exemplary embodiment of an interlock switching circuit according to the disclosure.

FIG. 3 shows a refinement of the circuit of an interlock switching circuit 1 depicted in FIG. 2. Therefore, only the differences or additions of the interlock switching circuit 1 according to FIG. 3 as compared to FIG. 2 will be described in the following. The conductor loop 2, which is closed in FIG. 2, has been supplemented with a first voltage divider comprising the ohmic resistors $R_1$, $R_2$. The conductor loop 2 is not closed by an impedance $Z_L$, and so two terminals $IL_1$, $IL^2$ are available as output of the conductor loop 2. A negative input connection of an operational amplifier 5, as a regulator, is connected between the two ohmic resistors $R_1$, $R_2$. A positive input connection of the operational amplifier 5 is connected to the output of a second voltage divider which consists of two ohmic resistors $R_3$, $R_4$ connected in series to the battery voltage $U_B$. The output of the operational amplifier 5 is connected to a rectifier element in the form of a diode $D_0$ via an ohmic resistor $R_0$ as a current-limiting element. The diode $D_0$ is oriented in the reverse direction toward the output of the operational amplifier 5. On the other side, the diode $D_0$ is connected to a feeding point 6 of a (non-illustrated) second current source which coincides with an output of the first current mirror 10 and the conductor loop 2.

Figure 4:
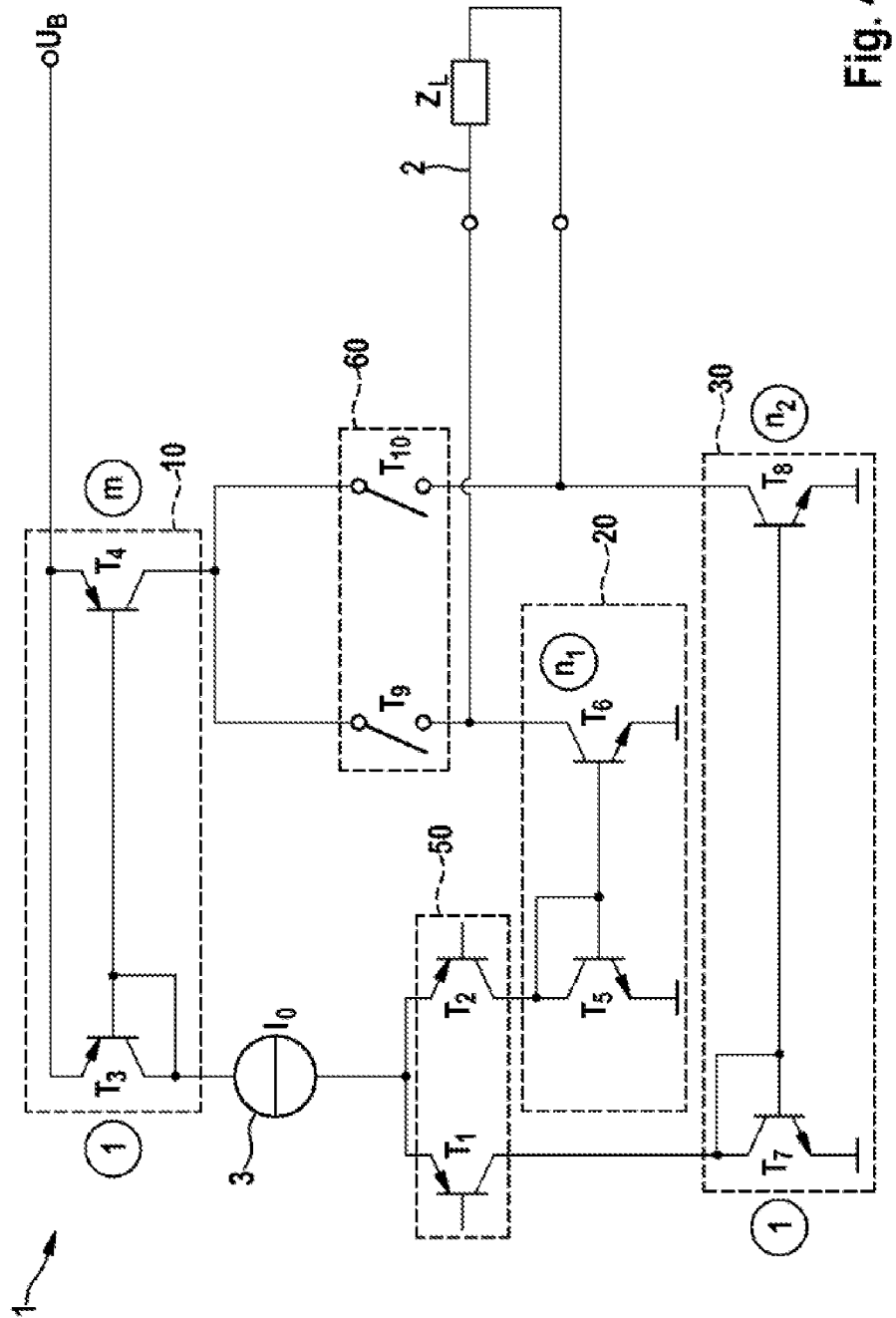
FIG. 4 shows a wiring diagram of a third exemplary embodiment of an interlock switching circuit according to the disclosure.

FIG. 4 shows a wiring diagram of another exemplary embodiment of an interlock switching circuit 1 according to the disclosure. The differences as compared to the arrangement shown in FIG. 2 are discussed in the following. In addition to the arrangement shown in FIG. 2, a third current mirror 30 comprising a first transistor $T_7$ and a second transistor $T_8$ is provided, which current mirror realizes a voltage ratio $n_2$ between an output current and an input current. The inputs of the second current mirror 20 and of the third current mirror 30 can be connected to the first current source 3 via a first switching device 50 comprising a first transistor $T_1$ and a second transistor $T_2$. The output of the first current mirror 10 can be optionally connected to the output of the second current mirror 20 or of the third current mirror 30 via a second switching device 60 comprising a first transistor $T_9$ and a second transistor $T_{10}$. A conductor loop 2 is connected between the second switching device 60 and the outputs of the second current mirror 20 or of the third current mirror 30 such that a first connection of the conductor loop 2 is connected to the output of the second current mirror 20 and a second connection of the conductor loop 2 is connected to the output of the third current mirror 30. The voltage ratio $n_1$ of the second current mirror 20 is preferably equal in size to the voltage ratio $n_2$ of the third current mirror 30. In addition to the functionality of the circuit shown in FIG. 2, the current direction through the conductor loop 2 can be specified by means of an appropriate control of the first switching device 50 and of the second switching device 60, thereby making it possible to better localize an interruption or a short circuit of the conductor loop 2.

Even if the aspects according to the disclosure and advantageous embodiments have been described in detail with reference to the exemplary embodiments explained in combination with the attached figures of the drawing, modifications and combinations of features of the depicted exemplary embodiments are possible for a person skilled in the art without departing from the scope of the present disclosure, the scope of protection of which is defined by the attached claims.

The invention claimed is:

1. An interlock switching circuit for protecting an electrical on-board power supply of an electrically drivable vehicle, comprising:
   a conductor loop;
   a first current source;
   a first current mirror;
   a second current mirror;
   a third current mirror;
   a first switching device; and
   a second switching device,
   wherein the first current source is configured to drive a current flowing out of an input of the first current mirror into an input of the second current mirror,
   wherein the conductor loop is connected between an output of the first current mirror and an output of the second current mirror,
   wherein the first switching device is configured to optionally switch the first current source (i) between the input of the first current mirror and the input of the second current mirror, or (ii) between the input of the first current mirror and an input of the third current mirror, and
   wherein the second switching device is configured to optionally connect the output of the first current mirror to the output of the second current mirror or to an output of the third current mirror.

2. The interlock switching circuit as claimed in claim 1, further comprising:
   a regulator;
   a first voltage divider; and
   a second voltage divider,
   wherein the first voltage divider is disposed parallel to the conductor loop between the output of the first current mirror and the output of the second current mirror,
   wherein the second voltage divider is configured to provide a reference variable for the regulator, and
   wherein an input of the regulator is disposed between the first voltage divider and the second voltage divider.

3. The interlock switching circuit as claimed in claim 2, further comprising:
   a second current source; and
   a rectifier element,
   wherein the second current source is configured to feed a current between the output of the first current mirror and the conductor loop, and
   wherein an output of the regulator is also connected, via the rectifier element, between the output of the first current mirror and the conductor loop.

4. The interlock switching circuit as claimed in claim 1, wherein the conductor loop begins between the second switching device and the output of the second current mirror and ends between the second switching device and the output of the third current mirror.

5. The interlock switching circuit as claimed in claim 1, wherein:
   the first switching device and the second switching device each comprise a first and a second transistor,
   the first transistor of the first switching device is configured to connect the first current source and the input of the third current mirror to one another,
   the second transistor of the first switching device is configured to connect the first current source and the input of the second current mirror to one another,
   the first transistor of the second switching device is configured to connect the outputs of the first current mirror and of the second current mirror, and the second transistor of the second switching device is configured to connect the outputs of the first current mirror and of the third current mirror.

6. The interlock switching circuit as claimed in claim 5, wherein at least one of:
the first, the second, and the third current mirror each comprise a first and a second transistor, which are configured as bipolar transistors or as MOSFETs, and
the transistors of the first switching device and the transistors of the second switching device are configured as bipolar transistors or as MOSFETs.

7. The interlock switching circuit as claimed in claim 1, further comprising:
a current-direction control unit configured to control the first switching device and the second switching device for selecting a current direction through the conductor loop.

8. The interlock switching circuit as claimed in claim 1, wherein the second current mirror has a second voltage ratio and the third current mirror has a third voltage ratio, whereby the interlock switching circuit is configured to change a particular current mirrored by the second current mirror or by the third current mirror to a multiple of the current flowing through the first current source, which multiple corresponds to a particular voltage ratio.

9. The interlock switching circuit as claimed in claim 1, wherein the first current mirror has a first voltage ratio, which is greater than at least one of a second voltage ratio of the second current mirror, and a third voltage ratio of the third current mirror.

10. The interlock switching circuit as claimed in claim 2, wherein:
the first voltage divider has two ohmic resistances having essentially the same magnitude, and
the second voltage divider has two ohmic resistances having essentially the same magnitude.

11. The interlock switching circuit as claimed in claim 3, wherein a current-limiting element is disposed between the output of the regulator and the conductor loop.

12. The interlock switching circuit as claimed in claim 8, wherein the second voltage ratio and the third voltage ratio are of the same size.

13. An interlock switching circuit for protecting an electrical on-board power supply of an electrically drivable vehicle, comprising:
a conductor loop;
a first current source;
a first current mirror;
a second current mirror;
a regulator;
a first voltage divider; and
a second voltage divider,
wherein the first current source is configured to drive a current flowing out of an input of the first current mirror into an input of the second current mirror,
wherein the conductor loop is connected between an output of the first current mirror and an output of the second current mirror,
wherein the first voltage divider is disposed parallel to the conductor loop between the output of the first current mirror and the output of the second current mirror,
wherein the second voltage divider is configured to provide a reference variable for the regulator, and
wherein an input of the regulator is disposed between the first voltage divider and the second voltage divider.

14. The interlock switching circuit as claimed in claim 13, wherein:
the first voltage divider has two ohmic resistances having essentially the same magnitude, and
the second voltage divider has two ohmic resistances having essentially the same magnitude.

15. An interlock switching circuit for protecting an electrical on-board power supply of an electrically drivable vehicle, comprising:
a conductor loop;
a first current source;
a first current mirror;
a second current mirror;
a second current source; and
a rectifier element,
wherein the first current source is configured to drive a current flowing out of an input of the first current mirror into an input of the second current mirror,
wherein the conductor loop is connected between an output of the first current mirror and an output of the second current mirror,
wherein the second current source is configured to feed a current between the output of the first current mirror and the conductor loop, and
wherein an output of the regulator is also connected, via the rectifier element, between the output of the first current mirror and the conductor loop.

16. The interlock switching circuit as claimed in claim 15, wherein a current-limiting element is disposed between the output of the regulator and the conductor loop.

* * * * *